(12) United States Patent
Cariou et al.

(10) Patent No.: US 10,097,674 B2
(45) Date of Patent: Oct. 9, 2018

(54) SINGLE USER OFDM WITH BIT LOADING IN WIRELESS COMMUNICATIONS

(71) Applicant: Intel IP Corporation, Santa Clara, CA (US)

(72) Inventors: Laurent Cariou, Portland, OR (US); Carlos Cordeiro, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/392,840

(22) Filed: Dec. 28, 2016

(65) Prior Publication Data

US 2018/0183909 A1 Jun. 28, 2018

(51) Int. Cl.
| | | |
|---|---|---|
| *H04L 29/08* | (2006.01) | |
| *H04L 27/26* | (2006.01) | |
| *H04L 1/00* | (2006.01) | |
| *H04L 29/06* | (2006.01) | |
| *H03M 13/25* | (2006.01) | |

(52) U.S. Cl.
CPC ........ *H04L 69/324* (2013.01); *H03M 13/255* (2013.01); *H04L 1/0003* (2013.01); *H04L 1/0009* (2013.01); *H04L 1/0057* (2013.01); *H04L 27/2601* (2013.01); *H04L 69/22* (2013.01)

(58) Field of Classification Search
USPC ......... 375/265, 295, 261, 219, 267
See application file for complete search history.

(56) References Cited

U.S. PATENT DOCUMENTS

| 8,767,854 | B2* | 7/2014 | Zheng | H04L 27/2626 |
| | | | | 370/203 |
| 8,989,102 | B2* | 3/2015 | Kenney | H04L 27/2613 |
| | | | | 370/252 |
| 9,419,653 | B1* | 8/2016 | Chaichanavong | H03M 5/145 |
| 2007/0223618 | A1* | 9/2007 | Jeong | H04B 7/0473 |
| | | | | 375/267 |
| 2013/0343478 | A1* | 12/2013 | Yang | H04L 27/2618 |
| | | | | 375/295 |
| 2015/0288437 | A1* | 10/2015 | Raju | H04B 7/0486 |
| | | | | 375/219 |
| 2016/0277037 | A1* | 9/2016 | Kajihara | H03M 13/2792 |
| 2016/0309457 | A1* | 10/2016 | Eitan | H04L 1/0079 |
| 2017/0104553 | A1* | 4/2017 | Liu | H04L 1/0041 |

* cited by examiner

*Primary Examiner* — Eva Puente
(74) *Attorney, Agent, or Firm* — Patent Capital Group

(57) ABSTRACT

In single user OFDM wireless communication, the serial bit stream in a Medium access control Protocol Data Unit (MPDU) to be transmitted may be split up and routed in parallel through different encoding modules. In one embodiment the entire bit stream may be processed through an LDPC, and the output of the LDPC module split up before being routed to different Modulation Modules that each select a separate MCS for the associated sub-band. In another embodiment the bit stream may be split up before being processed separately through multiple LDPC modules, and the output of each LDPC module may then be routed to a different associated Modulation Module for selection of a separate MCS for the associated sub-band.

17 Claims, 7 Drawing Sheets

| L-STF | L-CEF | L-Header | EDMG-Header-A | EDMG-STF | EDMG-CEF | EDMG-Header-B | Data | AGC | TRN |

EDMG PPDU format

FIG. 5

SINGLE USER OFDM WITH BIT LOADING IN WIRELESS COMMUNICATIONS

BACKGROUND

Wireless communication uses various techniques to communicate digital data. One such technique is to transmit bits serially over a wideband channel. It has been shown, however, that dividing the wideband channel into multiple narrowband channels, or sub-bands, and transmitting different portions of the bits in parallel over each sub-band, can result in higher throughput. Also, each sub-band may contain multiple sub-carriers. This technique may be known as Orthogonal Frequency Division Multiplexing (OFDM). Frequently, each of the sub-bands may use the same modulation and coding scheme (MCS), which simplifies the relevant circuitry. Also, typically the bit stream is split up somewhere between the Low Density Parity Check (LDPC) operation and the multiple sub-band transmission circuitry.

BRIEF DESCRIPTION OF THE DRAWINGS

Some embodiments of the invention may be better understood by referring to the following description and accompanying drawings that are used to illustrate embodiments of the invention. In the drawings:

FIG. 5 shows a format for an enhanced directional multi-gigabit (EDMG) PHY Protocol Data Unit (PPDU), according to an embodiment of the invention.

DETAILED DESCRIPTION

Figure 1:
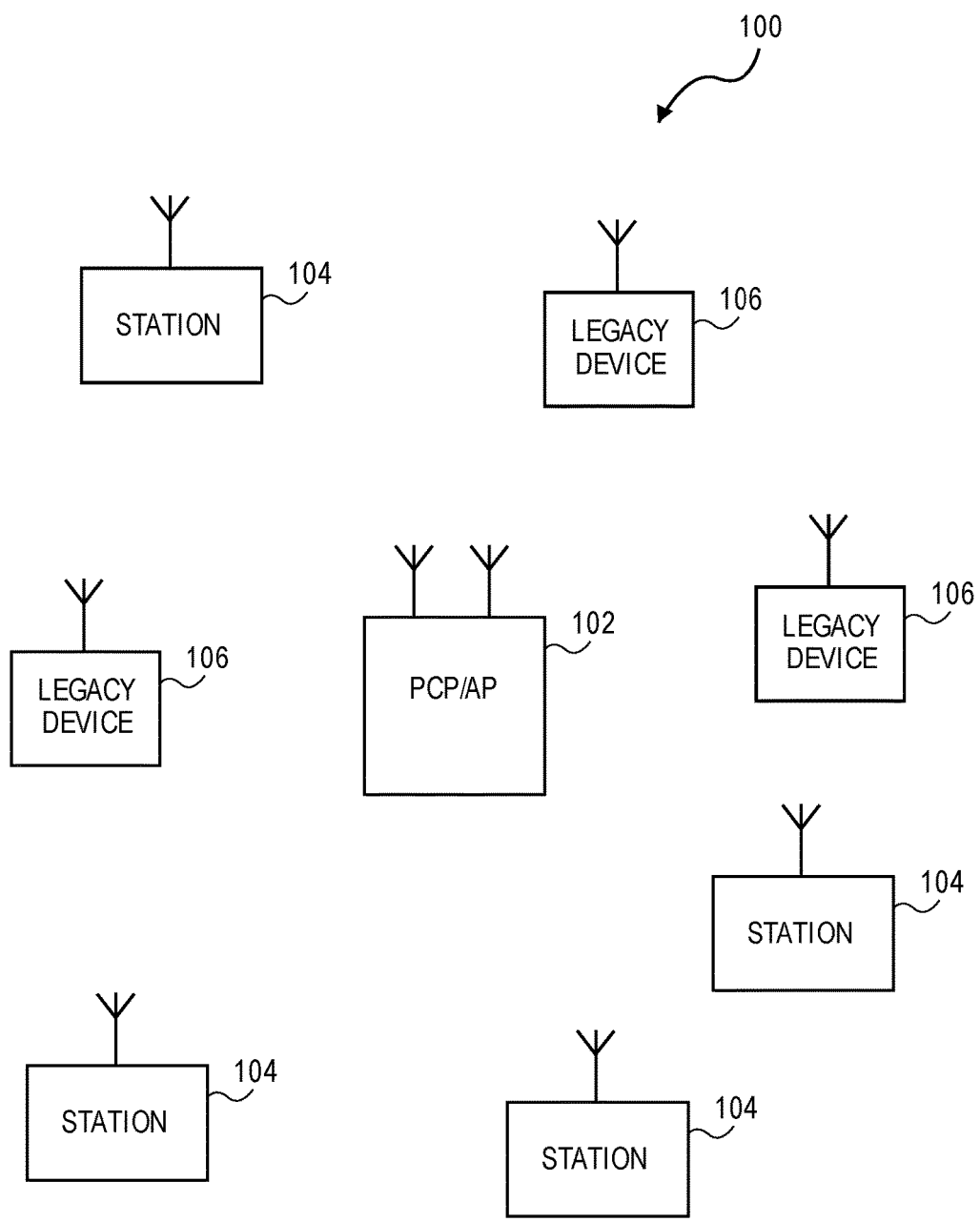
FIG. 1 shows a wireless communications network, according to an embodiment of the invention.

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

References to a "module" refer to any one or more of hardware, processor(s), memory, software, and/or instructions, etc., that perform any one or more of the functions described herein.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Various embodiments of the invention may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "wireless" may be used to describe circuits, devices, systems, methods, techniques, communications channels, etc., that communicate data by using modulated electromagnetic radiation through a non-solid medium. A wireless device may comprise at least one antenna, at least one radio, at least one memory, and at least one processor, where the radio(s) transmits signals through the antenna that represent data and receives signals through the antenna that represent data, while the processor(s) may process the data to be transmitted and the data that has been received. The processor(s) may also process other data which is neither transmitted nor received.

As used within this document, the term "access point" (AP) is intended to cover devices that schedule and control, at least partially, wireless communications by other devices in the network. An AP may also be known as a base station (BS), central point (CP), PBSS CP/AP (PCP/AP), or any other term that may arise to describe the functionality of a network controller.

As used within this document, the term "station" (STA) is intended to cover those devices whose wireless communications are at least partially scheduled and controlled by the AP. A STA may also be known as a mobile device (MD), mobile station (MS), subscriber station (SS), user equipment (UE), or any other term that may arise to describe the functionality of a mobile device. Mobile devices may move during such communications, but movement is not required.

As used within this document, the term "communicate" is intended to include transmitting and/or receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as 'communicating', when only the functionality of one of those devices is being claimed.

FIG. 1 shows a network, according to an embodiment of the invention. In network 100, PCP/AP 102 may control the overall communications between itself and the stations 104 and legacy devices 106. Distinction is made between STAs and legacy devices because not all legacy devices may be able to implement all the various features described herein, but the PCP/AP may still need to control their communications. A communications format to accommodate both types of devices is shown later in this document. The devices in network 100 may operate in a wireless millimeter wave band, such as but not limited to the 60 GHz band.

Figure 2:
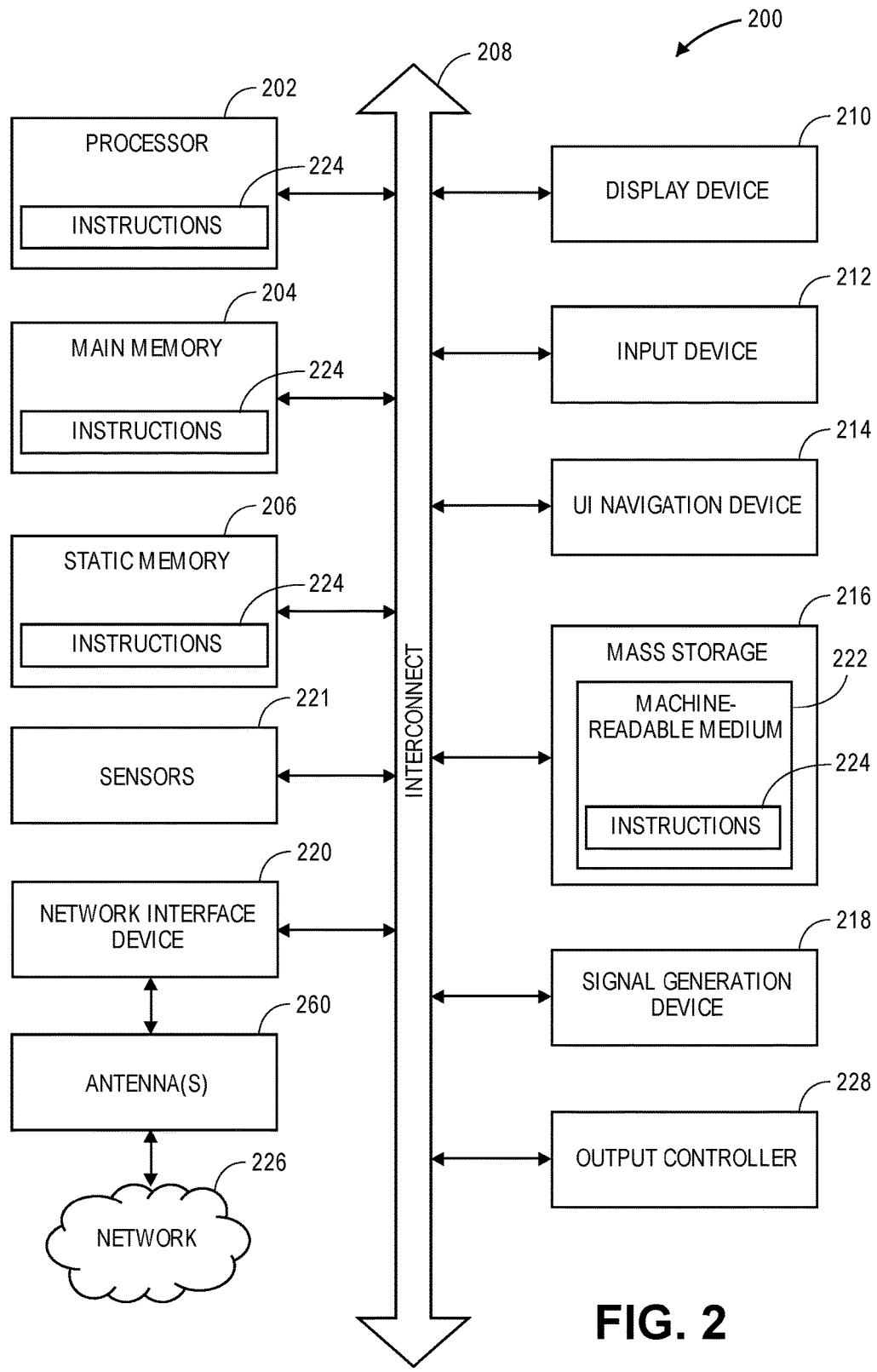
FIG. 2 shows a wireless communications device, according to an embodiment of the invention.

FIG. 2 shows a wireless communications device, according to an embodiment of the invention. The components shown in device 500 may be typical of PCP/APs 102, STAs 104, legacy devices 106, or any other wireless communication devices. A single interconnect 208 is shown tying all the components together, but multiple interconnects may be used in some embodiments. Any particular wireless communication device may have none, one, or more than one of any component shown. Although all the components in FIG. 2 may serve important functions, for the purpose of this description, particular attention may be paid to processor 202, main memory 204, network interface device 220, antenna 226, machine readable medium 218, and instructions located in any of these.

Figure 3:
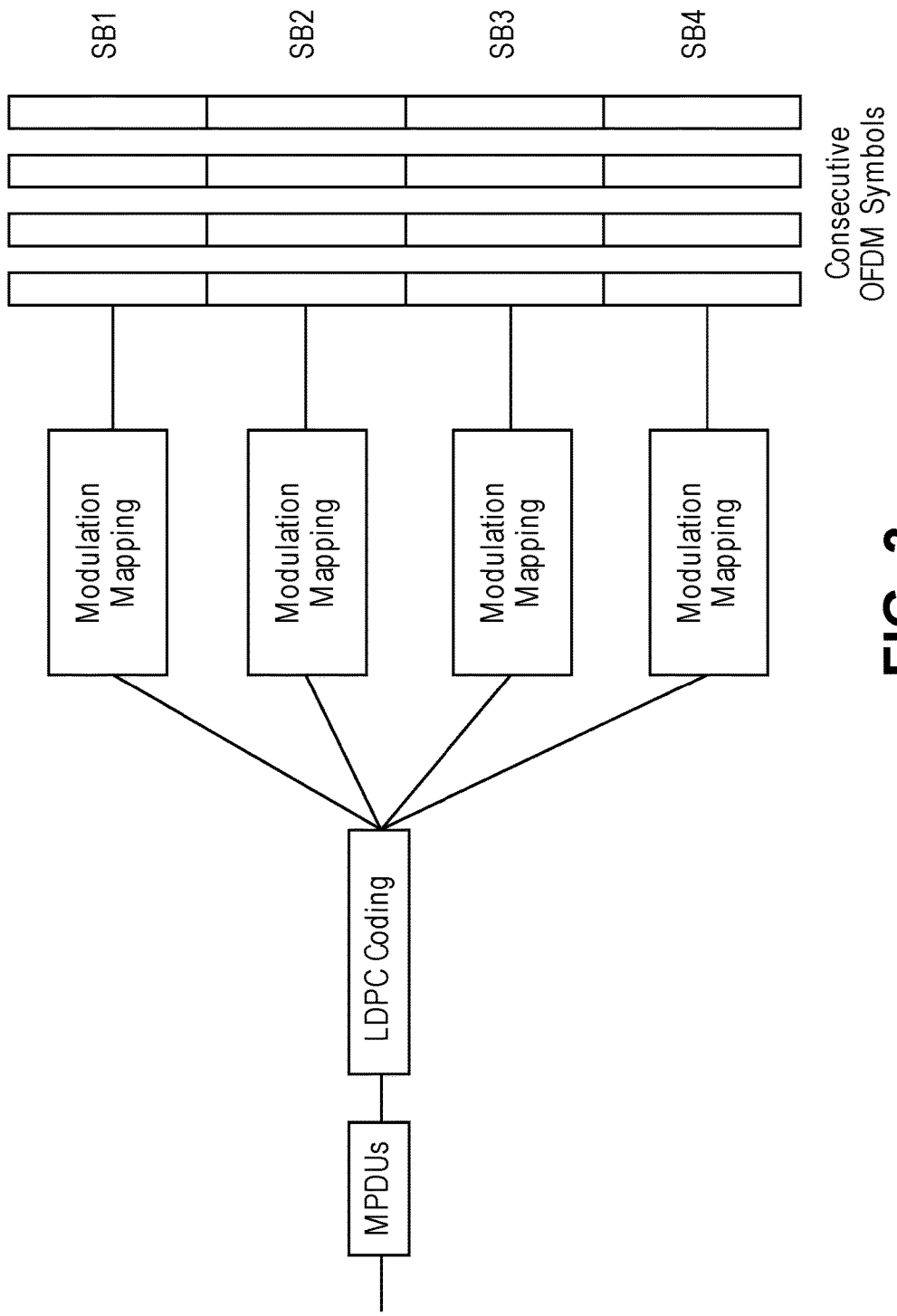
FIG. 3 shows a diagram of data flow in a wireless communication device, according to an embodiment of the invention.

FIG. 3 shows a diagram of functional data flow in a wireless communication device, according to an embodiment of the invention. This flow could be applied to any of PCP/AP 102 or STAs 104 in FIG. 1. The initial description assumes processing of data for transmission, with the data flow moving from left to right in FIG. 3. A later description assumes processing of data for reception, with the data flow moving from right to left in FIG. 3. The transmitter description starts with providing one or more units of data known as a medium access control (MAC) Protocol Data Unit, or MPDU. A complete transmission may contain multiple sequential MPDUs, but only one is shown here for simplicity of illustration. Constructing the MPDUs may have taken place previous to the indicated flow, and is not shown in FIG. 3. It is sufficient to know that the each MPDU may contain a string of binary bits to be transmitted, comprising content plus additional preamble and header information that can be used to interpret the content.

This MPDU may be processed through a low density parity check (LDPC) coding module to produce a longer string of bits, containing enough additional information for an eventual receiver to detect and correct a number of errors when the transmission is received. After the LDPC coding, the bits resulting from LDPC coding may be split up into bit strings, with different bit strings being sent to different Modulation Mapping modules. The illustrated example shows four such Modulation Mapping modules, but other quantities may be used instead. The bits from the LDPC Coding module may be split up in various ways. For example, in one embodiment the first Modulation Mapping module may receive a number of bits equal to: (the number of sub-carriers per sub-band)×(the number of bits intended per MCS symbol for sub-band SB1), while the second Modulation Mapping module may receive a number bits equal to: (the number of sub-carriers per sub-band)×(the number of bits intended per MCS symbol for sub-band SB2, and so forth for each LDPC Coding module and associated sub-band.

Within each Modulation Mapping module, the bits received by that module may be processed through the predetermined MCS associated with that LDPC module to produce an MCS output. The resulting symbols at the MCS output may be mapped to a vector representing the different sub-carriers of the OFDM modulation, at the sub-carrier locations corresponding to the sub-band. A single vector may gather all symbols from each sub-band PHY chain that will be transmitted in one OFDM symbol. A series of such vectors may result in a series of OFDM symbols.

For directional transmission using an antenna array, each OFDM symbol may be sent to multiple transmission chains where each chain may subject the signal to different phase shifting and/or amplitude adjustments before being presented to the individual antenna elements. This combining of signals and separate treatment in different transmission chains may take place to the right of the Consecutive OFDM Symbols portion of FIG. 3, and is not shown.

Figure 4:
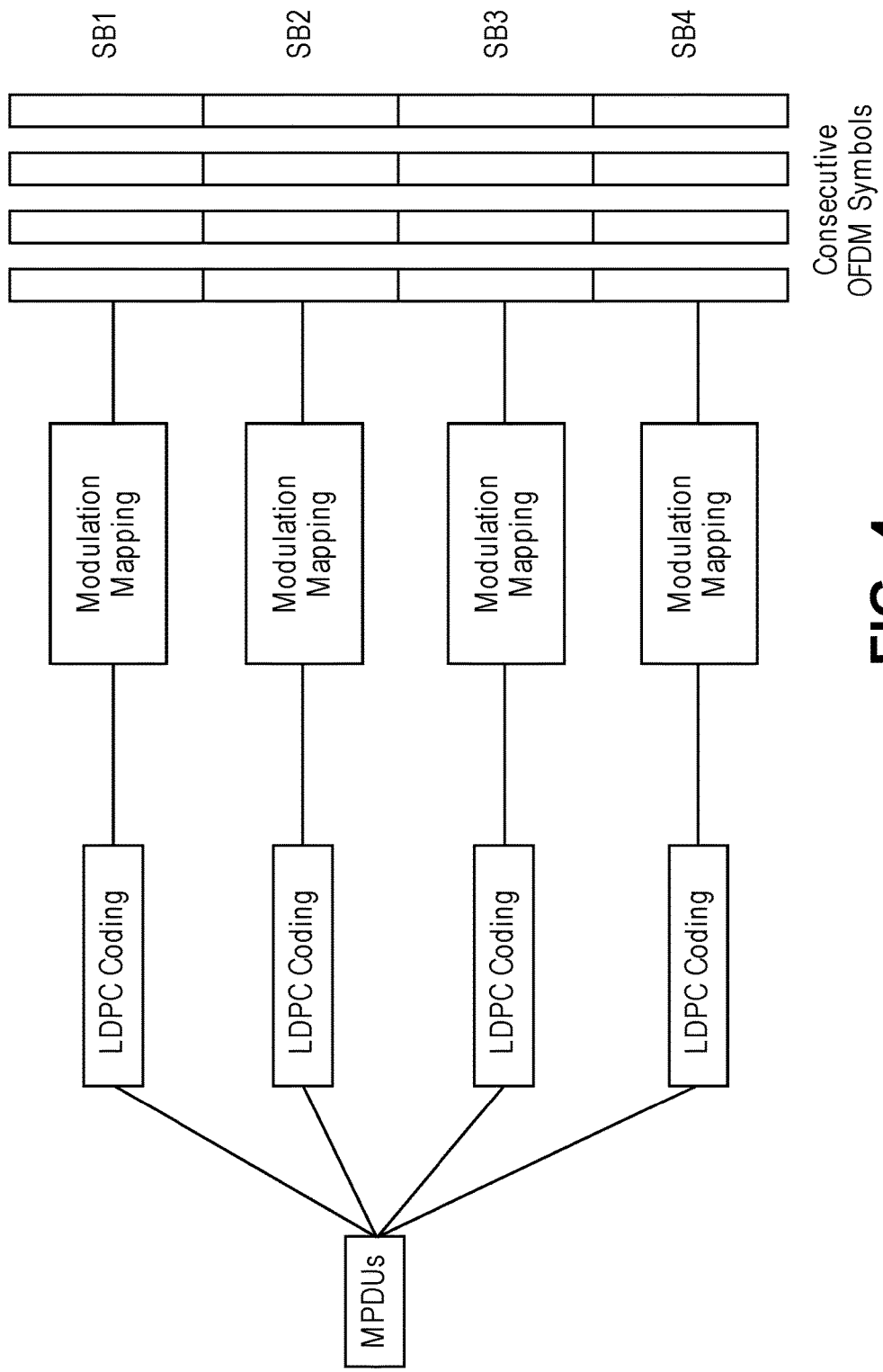
FIG. 4 shows another diagram of data flow in a wireless communication device, according to an embodiment of the invention.

FIG. 4 shows another diagram of functional data flow in a wireless communication device, according to an embodiment of the invention. The flow of FIG. 4 is similar to the flow of FIG. 3, except that in FIG. 4 the bits of the MPDUs are split up before going to the LPDC Coding stage instead of after that stage. Four such LPDC Coding modules are shown, corresponding to the four Modulation Mapping modules and four sub-channels that are shown, but other quantities may also be used. The bits coming from the MPDU may be separated into separate groups of bits, with each group going to a separate LPDC Coding module. As before, these bits may be split into groups in various ways. For example, in one embodiment the first LDPC module may receive a first group of bits whose quantity is equal to: (the number of sub-carriers per sub-band)×(the number of bits intended per MCS symbol for sub-band SB1)/(coding rate for SB1), while the second LDPC module may receive a second group of bits whose quantity is equal to: (the number of sub-carriers per sub-band)×(the number of bits intended per MCS symbol for sub-band SB2/(coding rate for SB2), and so forth for each of the remaining LDPC modules and sub-bands.

As described for FIG. 3, each LPDC Coding module may process its incoming bits in a manner that produces a longer string of bits, containing enough additional information for an eventual receiver to detect and correct a number of errors when the transmission is received. Also similar to the description for FIG. 3, within each Modulation Mapping module, the bits received by that module may then be processed through a predetermined Modulation and Coding Scheme (MCS) to produce an MCS output. The resulting symbols at the MCS output may be mapped to a vector representing the different sub-carriers of the OFDM modulation, at the sub-carrier locations corresponding to the sub-band. A single vector may gather all symbols from each sub-band PHY chain that will be transmitted in one OFDM symbol. A series of such vectors may result in a series of OFDM symbols.

For reception, the reverse flow of FIGS. 3 and 4 may be followed. This description follows a right-to-left flow through those figures. For example, in FIG. 3 a radio may take a signal containing the combined frequencies of the multiple sub-bands and separate out the combined signal into separate sub-bands (e.g., SB1-SB4) in the radio, then convert each of those into an analog signal. The consecutive OFDM symbols may also flow from right-to-left in the figure. In this case, each analog signal may be fed into its respective Modulation Mapping module, where the associated MCS may be applied in reverse to convert the analog signal into a string of binary bits. Then, the string of bits from each Modulation Mapping module may be combined with the strings of bits from the other Modulation Mapping modules in the reverse order in which they were separated in the transmission process previously described. This combined string of bits may then go through reverse LDPC coding to check for errors, correct those errors if necessary, and reproduce the original MPDU(s). In some cases, it is possible that the number of errors will be greater than can be corrected with the LDPC algorithm. If so, the original message may be retransmitted, and this process repeated for the new MPDUs. Such a retransmission process is beyond the scope of this document.

In a similar manner to that described for FIG. 3 for the receiver, the following describes functional flow through a receiver in FIG. 4. For example, in FIG. 4 a radio may take a signal containing the combined frequencies of the multiple sub-bands and separate out the combined signal into separate sub-bands (e.g., SB1-SB4) in a radio, then convert each of those into an analog signal. The consecutive OFDM symbols may flow from right-to-left in the figure. In this case, each analog signal may be fed into its respective Modulation Mapping module, where the associated MCS may be applied to convert the analog signal into a string of binary bits.

The string of binary bits from each Modulation Mapping module may then go through reverse LDPC coding in an associated LDPC coding module to check for errors, correct those errors if necessary, and reproduce the original string of bits that was fed into the equivalent LPDC Coding module in the transmitter. All the strings of binary bits from the multiple LPDC Coding modules may then be recombined in the reverse order in which they were separated in the transmitter to recreate the original MPDU(s). It is possible that more errors may be detected by one of the LPDC coding modules than can be corrected. In this case, it may be necessary to request a retransmission. However, unlike the receiver of FIG. 3, it may be possible to request retransmission of only the sub-band that carried the uncorrectable received data. The details of how to handle such a selective request are beyond the scope of this document.

FIG. 5 shows a format for an enhanced directional multi-gigabit (EDMG) PHY Protocol Data Unit (PPDU), according to an embodiment of the invention. In particular, the EDMG-Header-A subfield may be used to specify MCS assignments to the various sub-bands. This may be done in various ways. For example, in one embodiment a direct MCS-to-sub-band correspondence may be indicated (e.g., MCS5 for SB1, MCS7 for SB2, etc.). In another embodiment, a baseline MCS number with a differential MCS index adjustment per sub-band may be used to reduce the size of this field (e.g., a baseline MCS of 6, SB1 adjustment=−1, SB2 adjustment=+1, etc.). Other techniques may also be used to indicate which MCS is to be used with each sub-band. By including this in a field of the PHY header which is transmitted on the whole bandwidth, the receiving device may be able to determine immediately which MCS to use for decoding the data signal from each sub-band, before such decoding is needed.

Figure 6:
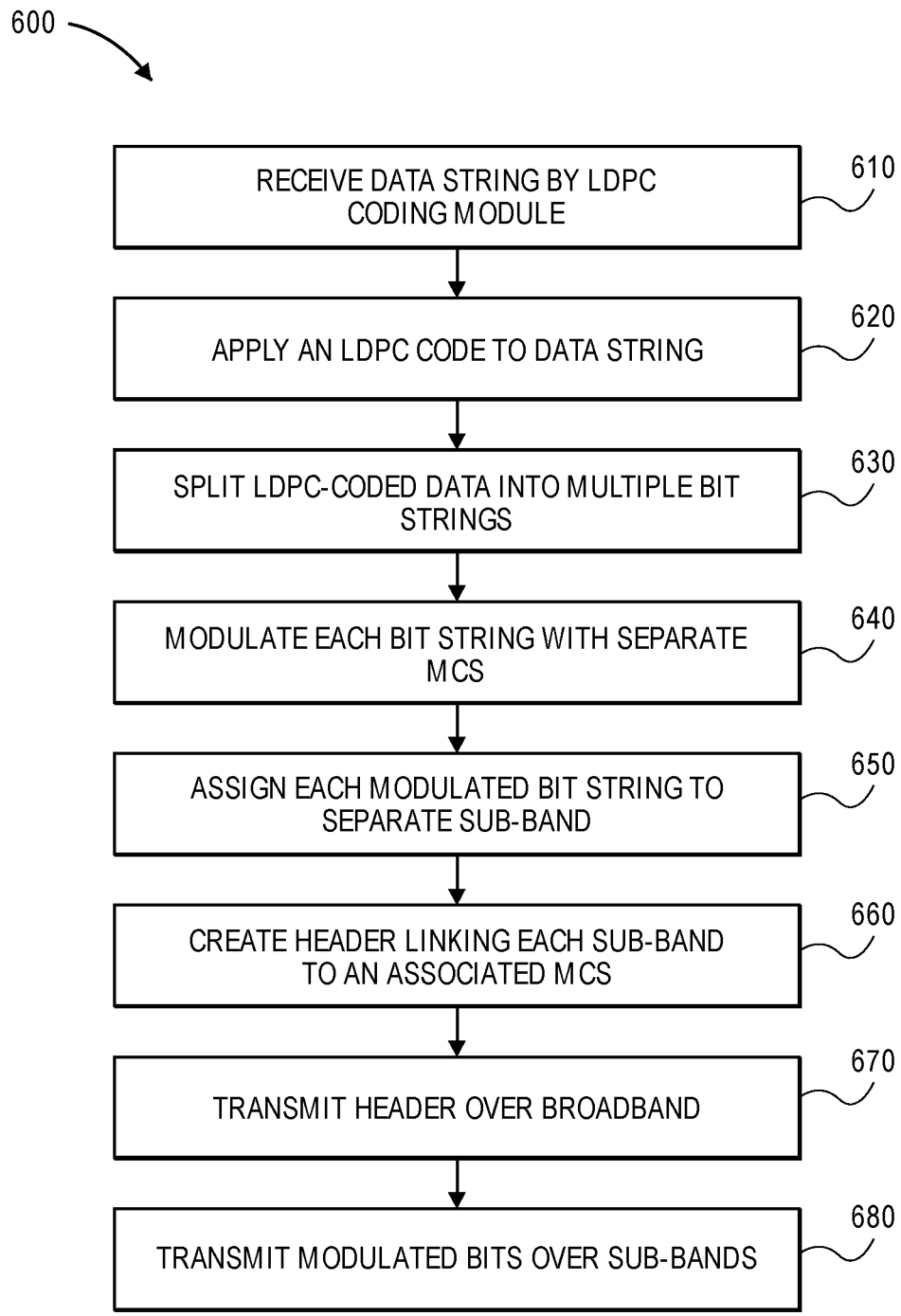
FIG. 6 shows a flow diagram of a method related to FIG. 3, according to an embodiment of the invention.

FIG. 6 shows a flow diagram of a method related to FIG. 3, according to an embodiment of the invention. Flow diagram 600 shows operations that may be performed in preparing data for transmission over multiple OFDM sub-bands. For example, at 610 a data string may be received by an LDPC coding module, which may apply an LDPC code to the data string at 620. After being processed by the LDPC coding module, the resulting data may be split into multiple bit strings at 630. Each bit string may then be modulated with a separate MCS at 640. After modulation, at 650 each of the resulting modulated analog signals may be assigned to one of the sub-bands to be used in transmission.

Information that associates each sub-band with its assigned MCS needs to be received and decoded by the receiving device before it can decode the individual sub-bands. Therefore a header may be created at 660, linking each sub-band to the particular MCS used to modulate that bit string. This header may then be wirelessly transmitted at 670 to potential receivers over broadband, so that the receivers will not need to have any MCS/sub-band associations to decode the header. Following transmission of the header, the bit strings modulated at 640 may be transmitted in parallel at 680 over the frequencies assigned to those sub-bands.

Figure 7:
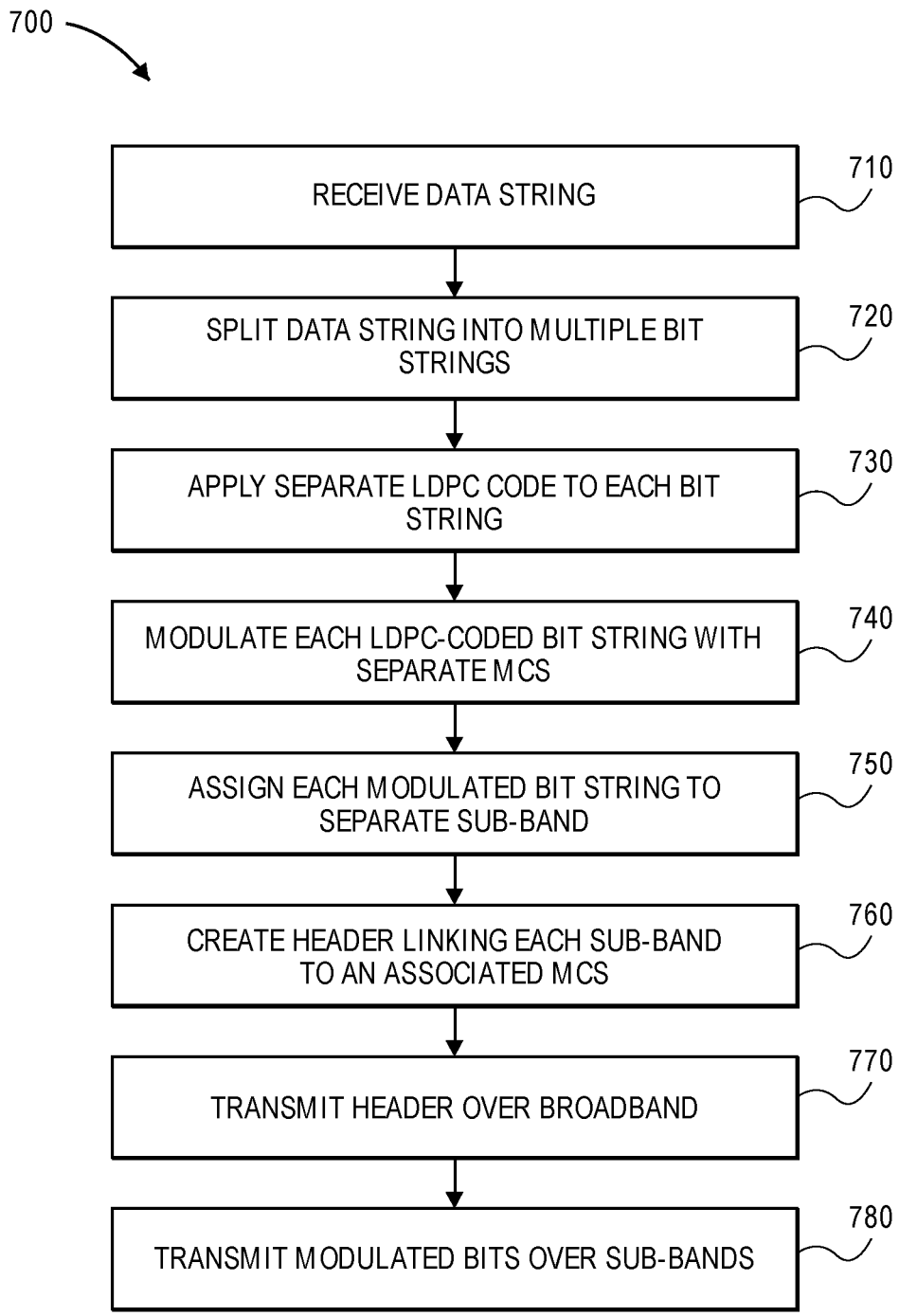
FIG. 7 shows a flow diagram of a method related to FIG. 4, according to an embodiment of the invention.

FIG. 7 shows a flow diagram of a method related to FIG. 4, according to an embodiment of the invention. Flow diagram 700 shows operations that may be performed in preparing data for transmission over multiple OFDM sub-bands. For example, at 710 a data string may be received, and split into multiple bit strings at 720. Each of these multiple bit strings may then have LDPC coding applied to it at 730. Each LDPC-coded bit string may then be modulated with a separate MCS at 740. After modulation, at 750 each of the resulting modulated analog signals may be assigned to one of the sub-bands to be used in transmission.

Information that associates each sub-band with its assigned MCS needs to be received and decoded by the receiving device before it can decode the individual sub-bands. Therefore a header may be created at 760, linking each sub-band to the particular MCS used to modulate that bit string. This header may then be wirelessly transmitted at 770 to potential receivers over broadband, so that the receivers will not need to have any previously known MCS/sub-band associations to decode the header. Following transmission of the header, the bit strings modulated at 740 may be transmitted in parallel at 780 over the assigned sub-bands.

For the transmitting device to assign a preferable MCS to each sub-band, it may be helpful for the transmitting device to have some feedback from the receiver about channel conditions on each of the sub-bands. This feedback may come from the receiver in various forms, such as but not limited to a particular field in a Block Acknowledgement, some other feedback frame, or piggybacked onto data in the reverse direction. Similarly, the content of this feedback may take various forms, such as but not limited to feedback of a complete channel matrix in response to channel sounding by the transmitter, a quality indication (such as SNR) per sub-band, or an MCS recommendation per sub-channel. This feedback may then be used to make MCS assignments for each sub-band in a subsequent transmission.

EXAMPLES

The following examples pertain to particular embodiments:

Example 1 includes a wireless communications device having a processor and a memory, the wireless communications device configured to: create a medium access control protocol data unit (MPDU); separate the MPDU into first and second groups of bits; apply a first low density parity check (LDPC) code to the first group of bits to produce a first bit string to be transmitted on a first sub-band; apply a second LDPC code to the second group of bits to produce a second bit string to be transmitted on a second sub-band; apply a first modulation and coding scheme (MCS) to the first bit string to produce a first MCS output; apply a second MCS to the second bit string to produce a second MCS output; map the first and second MCS outputs to a vector representing different sub-carriers of an orthogonal frequency division multiplex (OFDM) modulation, at sub-carrier locations corresponding to the first and second sub-bands; and transmit an OFDM symbol on the first and second sub-bands.

Example 2 includes the wireless communications device of example 1, wherein the first group of bits is to have a first number of bits equal to: (a number of sub-carriers on the first sub-band multiplied by a first number of bits intended per MCS symbol for the first sub-band) divided by (a first coding rate for the first sub-band), and wherein the second group of bits has a second number of bits equal to: (a number of sub-carriers on the second sub-band multiplied by a second number of bits intended per MCS symbol for the second sub-band) divided by (a second coding rate for the second sub-band).

Example 3 includes the wireless communications device of example 1, further configured to transmit a PHY header, the PHY header containing an EDMG-Header-A field to indicate which first modulation and coding scheme (MCS) is to be used for the first sub-band in the OFDM symbol.

Example 4 includes the wireless communications device of example 3, wherein the EDMG-Header-A field is further to indicate which second MCS to be used for the second sub-band in the OFDM symbol.

Example 5 includes the wireless communications device of example 1, further comprising an antenna array with multiple elements coupled to the processor.

Example 6 includes the wireless communications device of example 3, wherein the wireless communications device is to communicate over a millimeter wave band.

Example 7 includes a method of communicating in a wireless network, comprising creating a medium access control protocol data unit (MPDU); separating the MPDU into first and second groups of bits; applying a first low density parity check (LDPC) code to the first group of bits to produce a first bit string to be transmitted on a first sub-band; applying a second LDPC code to the second group of bits to produce a second bit string to be transmitted on a second sub-band; applying a first modulation and coding scheme (MCS) to the first bit string to produce a first MCS output; applying a second MCS to the second bit string to produce a second MCS output; mapping the first and second MCS outputs to a vector representing different sub-carriers of an orthogonal frequency division multiplex (OFDM) modulation, at sub-carrier locations corresponding to the first and second sub-bands; and transmitting an OFDM symbol on the first and second sub-bands.

Example 8 includes the method of example 7, wherein the first group of bits has a first number of bits equal to: (a number of sub-carriers on the first sub-band multiplied by a first number of bits intended per MCS symbol for the first sub-band) divided by (a first coding rate for the first sub-band), and wherein the second group of bits has a second number of bits equal to: (a number of sub-carriers on the second sub-band multiplied by a second number of bits intended per MCS symbol for the second sub-band) divided by (a second coding rate for the second sub-band).

Example 9 includes the method of example 7, further comprising transmitting a PHY header, the PHY header containing an EDMG-Header-A field to indicate which first modulation and coding scheme (MCS) is being used for the first sub-band in the OFDM symbol.

Example 10 includes the method of example 9, wherein the EDMG-Header-A field further indicates which second MCS is being used for the second sub-band in the OFDM symbol.

Example 11 includes the method of example 7, wherein the first and second sub-bands are within a millimeter wave band.

Example 12 includes a computer-readable non-transitory storage medium that contains instructions, which when executed by one or more processors result in performing operations comprising creating a medium access control protocol data unit (MPDU); separating the MPDU into first and second groups of bits; applying a first low density parity check (LDPC) code to the first group of bits to produce a first bit string to be transmitted on a first sub-band; applying a second LDPC code to the second group of bits to produce a second bit string to be transmitted on a second sub-band; applying a first modulation and coding scheme (MCS) to the first bit string to produce a first MCS output; applying a second MCS to the second bit string to produce a second MCS output; mapping the first and second MCS outputs to a vector representing different sub-carriers of an orthogonal frequency division multiplex (OFDM) modulation, at sub-carrier locations corresponding to the first and second sub-bands; and transmitting an OFDM symbol on the first and second sub-bands.

Example 13 includes the medium of example 12, wherein the first group of bits has a first number of bits equal to: (a number of sub-carriers on the first sub-band multiplied by a first number of bits intended per MCS symbol for the first sub-band) divided by (a first coding rate for the first sub-band), and wherein the second group of bits has a second number of bits equal to: (a number of sub-carriers on the second sub-band multiplied by a second number of bits intended per MCS symbol for the second sub-band) divided by (a second coding rate for the second sub-band).

Example 14 includes the medium of claim 12, wherein the operations further comprise transmitting a PHY header, the PHY header containing an EDMG-Header-A field to indicate which first modulation and coding scheme (MCS) is being used for the first sub-band in the OFDM symbol.

Example 15 includes the medium of example 14, wherein the EDMG-Header-A field further indicates which second MCS is being used for the second sub-band in the OFDM symbol.

Example 16 includes the medium of example 12, wherein the operations further comprise transmitting the first and second sub-bands within a millimeter wave band.

Example 17 includes a wireless communications device, having means to create a medium access control protocol data unit (MPDU); separate the MPDU into first and second groups of bits; apply a first low density parity check (LDPC) code to the first group of bits to produce a first bit string to be transmitted on a first sub-band; apply a second LDPC code to the second group of bits to produce a second bit string to be transmitted on a second sub-band; apply a first modulation and coding scheme (MCS) to the first bit string to produce a first MCS output; apply a second MCS to the second bit string to produce a second MCS output; map the first and second MCS outputs to a vector representing different sub-carriers of an orthogonal frequency division multiplex (OFDM) modulation, at sub-carrier locations corresponding to the first and second sub-bands; and transmit an OFDM symbol on the first and second sub-bands.

Example 18 includes the wireless communications device of example 17, further having means to make the first group of bits equal in number to: (a number of sub-carriers on the first sub-band multiplied by a first number of bits intended per MCS symbol for the first sub-band) divided by (a first coding rate for the first sub-band), and having means to make the second group of bits equal in number to: (a number of sub-carriers on the second sub-band multiplied by a second number of bits intended per MCS symbol for the second sub-band) divided by (a second coding rate for the second sub-band).

Example 19 includes the wireless communications device of example 17, further having means to transmit a PHY header, the PHY header containing an EDMG-Header-A field to indicate which first modulation and coding scheme (MCS) is to be used for the first sub-band in the OFDM symbol.

Example 20 includes the wireless communications device of example 19, wherein the EDMG-Header-A field is further to indicate which second MCS to be used for the second sub-band in the OFDM symbol.

Example 21 includes the wireless communications device of example 17, wherein the wireless communications device has means to transmit over a millimeter wave band.

Example 22 includes a wireless communications device having a processor and a memory, the wireless communications device configured to receive an orthogonal frequency division multiplex (OFDM) symbol over multiple sub-bands; translate the OFDM symbol into multiple signals, each signal representing a separate one of the multiple sub-bands; process each of the multiple signals with a separate modulation and coding scheme (MCS) to produce multiple demodulated bit strings; process each of the multiple demodulated bit strings through a reverse low density parity check (LDPC) code to produce multiple groups of bits; and combine the multiple groups of bits into a medium access control protocol data unit (MPDU).

Example 23 includes the wireless communications device of example 22, wherein each of the multiple group of bits is to have a quantity of bits equal to: (a number of sub-carriers on an associated sub-band) multiplied by (a number of bits intended for an associated MCS symbol) divided by (a first coding rate for the associated sub-band).

Example 24 includes the wireless communications device of example 22, further configured to receive a PHY header, the PHY header containing an EDMG-Header-A field to indicate which MCS is to be associated with which sub-band.

Example 25 includes the wireless communications device of example 22, further comprising an antenna array with multiple elements coupled to the processor.

Example 26 includes the wireless communications device of example 22, wherein the wireless communications device is configured to communicate over a millimeter wave band.

Example 27 includes a method of wireless communication, comprising receiving an orthogonal frequency division multiplex (OFDM) symbol over multiple sub-bands; translating the OFDM symbol into multiple signals, each signal representing a separate one of the multiple sub-bands; processing each of the multiple signals with a separate modulation and coding scheme (MCS) to produce multiple demodulated bit strings; processing each of the multiple demodulated bit strings through a reverse low density parity check (LDPC) code to produce multiple groups of bits; and combining the multiple groups of bits into a medium access control protocol data unit (MPDU).

Example 28 includes the method of example 27, wherein each of the multiple group of bits has a quantity of bits equal to: (a number of sub-carriers on an associated sub-band) multiplied by (a number of bits intended for an associated MCS symbol) divided by (a first coding rate for the associated sub-band).

Example 29 includes the method of example 27, further comprising receiving a PHY header, the PHY header containing an EDMG-Header-A field to indicate which MCS is to be associated with which sub-band.

Example 30 includes the method of example 27, further comprising communicating over a millimeter wave band.

Example 31 includes a computer-readable non-transitory storage medium that contains instructions, which when executed by one or more processors result in performing operations comprising receiving an orthogonal frequency division multiplex (OFDM) symbol over multiple sub-bands; translating the OFDM symbol into multiple signals, each signal representing a separate one of the multiple sub-bands; processing each of the multiple signals with a separate modulation and coding scheme (MCS) to produce multiple demodulated bit strings; processing each of the multiple demodulated bit strings through a reverse low density parity check (LDPC) code to produce multiple groups of bits; and combining the multiple groups of bits into a medium access control protocol data unit (MPDU).

Example 32 includes the medium of example 31, wherein each of the multiple group of bits has a quantity of bits equal to: (a number of sub-carriers on an associated sub-band) multiplied by (a number of bits intended for an associated MCS symbol) divided by (a first coding rate for the associated sub-band).

Example 33 includes the medium of example 31, wherein the operations further comprise receiving a PHY header, the PHY header containing an EDMG-Header-A field to indicate which MCS is to be associated with which sub-band.

Example 34 includes the medium of example 31, wherein the operations further comprise communicating over a millimeter wave band.

Example 35 includes a wireless communications device comprising means to receive an orthogonal frequency division multiplex (OFDM) symbol over multiple sub-bands; translate the OFDM symbol into multiple signals, each signal representing a separate one of the multiple sub-bands; process each of the multiple signals with a separate modulation and coding scheme (MCS) to produce multiple demodulated bit strings; process each of the multiple demodulated bit strings through a reverse low density parity check (LDPC) code to produce multiple groups of bits; and combine the multiple groups of bits into a medium access control protocol data unit (MPDU).

Example 36 includes the wireless communications device of example 35, wherein each of the multiple group of bits is to have a quantity of bits equal to: (a number of sub-carriers on an associated sub-band) multiplied by (a number of bits intended for an associated MCS symbol) divided by (a first coding rate for the associated sub-band).

Example 37 includes the wireless communications device of example 35, further comprising means to receive a PHY header, the PHY header containing an EDMG-Header-A field to indicate which MCS is to be associated with which sub-band.

Example 38 includes the wireless communications device of example 35, further comprising means to communicate over a millimeter wave band.

The foregoing description is intended to be illustrative and not limiting. Variations will occur to those of skill in the art. Those variations are intended to be included in the various embodiments of the invention, which are limited only by the scope of the following claims.

What is claimed is:

1. A wireless communications device having a processor and a memory, the wireless communications device configured to:
   create a medium access control protocol data unit (MPDU);
   separate the MPDU into first and second groups of bits;
   subsequent to said separation of the MPDU into first and second groups of bits, apply a first low density parity check (LDPC) code by a first LDPC module to the first group of bits to produce a first bit string to be transmitted on a first sub-band;
   subsequent to said separation of the MPDU into first and second groups of bits, apply a second LDPC code by a second LDPC module to the second group of bits to produce a second bit string to be transmitted on a second sub-band;
   apply a first modulation and coding scheme (MCS) to the first bit string to produce a first MCS output;
   apply a second MCS to the second bit string to produce a second MCS output;
   map the first and second MCS outputs to a vector representing different sub-carriers of an orthogonal frequency division multiplex (OFDM) modulation, at sub-carrier locations corresponding to the first and second sub-bands; and
   transmit an OFDM symbol on the first and second sub-bands;
   wherein the first group of bits is to have a first number of bits equal to: (a number of sub-carriers on the first sub-band multiplied by a first number of bits intended per MCS symbol for the first sub-band) divided by (a first coding rate for the first sub-band), and wherein the second group of bits has a second number of bits equal to: (a number of sub-carriers on the second sub-band multiplied by a second number of bits intended per MCS symbol for the second sub-band) divided by (a second coding rate for the second sub-band).

2. The wireless communications device of claim 1, further configured to:
   transmit a PHY header, the PHY header containing an EDMG-Header-A field to indicate which first modulation and coding scheme (MCS) is to be used for the first sub-band in the OFDM symbol.

3. The wireless communications device of claim 2, wherein the EDMG-Header-A field is further to indicate which second MCS to be used for the second sub-band in the OFDM symbol.

4. The wireless communications device of claim 2, wherein the wireless communications device is to communicate over a millimeter wave band.

5. The wireless communications device of claim 1, further comprising an antenna array with multiple elements coupled to the processor.

6. A non-transitory computer-readable non-transitory storage medium that contains instructions, which when executed by one or more processors result in performing operations comprising:
   creating a medium access control protocol data unit (MPDU);
   separating the MPDU into first and second groups of bits;
   subsequent to said separation of the MPDU into first and second groups of bits, applying a first low density parity check (LDPC) code to the first group of bits to produce a first bit string to be transmitted on a first sub-band;
   subsequent to said separation of the MPDU into first and second groups of bits, applying a second LDPC code to the second group of bits to produce a second bit string to be transmitted on a second sub-band;
   applying a first modulation and coding scheme (MCS) to the first bit string to produce a first MCS output;
   applying a second MCS to the second bit string to produce a second MCS output;
   mapping the first and second MCS outputs to a vector representing different sub-carriers of an orthogonal frequency division multiplex (OFDM) modulation, at sub-carrier locations corresponding to the first and second sub-bands; and
   transmitting an OFDM symbol on the first and second sub-bands;
   wherein the first group of bits has a first number of bits equal to: (a number of sub-carriers on the first sub-band multiplied by a first number of bits intended per MCS symbol for the first sub-band) divided by (a first coding rate for the first sub-band), and wherein the second group of bits has a second number of bits equal to: (a number of sub-carriers on the second sub-band multiplied by a second number of bits intended per MCS symbol for the second sub-band) divided by (a second coding rate for the second sub-band).

7. The medium of claim 6, wherein the operations further comprise transmitting a PHY header, the PHY header containing an EDMG-Header-A field to indicate which first modulation and coding scheme (MCS) is being used for the first sub-band in the OFDM symbol.

8. The medium of claim 7, wherein the EDMG-Header-A field further indicates which second MCS is being used for the second sub-band in the OFDM symbol.

9. The medium of claim 6, wherein the operations further comprise transmitting the first and second sub-bands within a millimeter wave band.

10. A wireless communications device having means to:
    create a medium access control protocol data unit (MPDU);
    separate the MPDU into first and second groups of bits;
    subsequent to said separation of the MPDU into first and second groups of bits, apply a first low density parity check (LDPC) code to the first group of bits to produce a first bit string to be transmitted on a first sub-band;
    subsequent to said separation of the MPDU into first and second groups of bits, apply a second LDPC code to the second group of bits to produce a second bit string to be transmitted on a second sub-band;
    apply a first modulation and coding scheme (MCS) to the first bit string to produce a first MCS output;
    apply a second MCS to the second bit string to produce a second MCS output;
    map the first and second MCS outputs to a vector representing different sub-carriers of an orthogonal frequency division multiplex (OFDM) modulation, at sub-carrier locations corresponding to the first and second sub-bands; and
    transmit an OFDM symbol on the first and second sub-bands;

wherein the first group of bits is to have a first number of bits equal to: (a number of sub-carriers on the first sub-band multiplied by a first number of bits intended per MCS symbol for the first sub-band) divided by (a first coding rate for the first sub-band), and wherein the second group of bits has a second number of bits equal to: (a number of sub-carriers on the second sub-band multiplied by a second number of bits intended per MCS symbol for the second sub-band) divided by (a second coding rate for the second sub-band).

11. A wireless communications device having a processor and a memory, the wireless communications device configured to:
  receive an orthogonal frequency division multiplex (OFDM) symbol over multiple sub-bands;
  translate the OFDM symbol into multiple signals, each signal representing a separate one of the multiple sub-bands;
  process each of the multiple signals with a separate modulation and coding scheme (MCS) to produce multiple demodulated bit strings;
  process each of the multiple demodulated bit strings through a separate reverse low density parity check (LDPC) code to produce multiple groups of bits; and
  combine the multiple groups of bits into a medium access control protocol data unit (MPDU);
  wherein each of the multiple group of bits is to have a quantity of bits equal to: (a number of sub-carriers on an associated sub-band) multiplied by (a number of bits intended for an associated MCS symbol) divided by (a first coding rate for the associated sub-band).

12. The wireless communications device of claim 11, further configured to:
  receive a PHY header, the PHY header containing an EDMG-Header-A field to indicate which MCS is to be associated with which sub-band.

13. The wireless communications device of claim 11, further comprising an antenna array with multiple elements coupled to the processor.

14. The wireless communications device of claim 11, wherein the wireless communications device is configured to communicate over a millimeter wave band.

15. A non-transitory computer-readable non-transitory storage medium that contains instructions, which when executed by one or more processors result in performing operations comprising:
  receiving an orthogonal frequency division multiplex (OFDM) symbol over multiple sub-bands;
  translating the OFDM symbol into multiple signals, each signal representing a separate one of the multiple sub-bands;
  processing each of the multiple signals with a separate modulation and coding scheme (MCS) to produce multiple demodulated bit strings;
  processing each of the multiple demodulated bit strings through a separate reverse low density parity check (LDPC) code to produce multiple groups of bits; and
  combining the multiple groups of bits into a medium access control protocol data unit (MPDU);
  wherein each of the multiple group of bits has a quantity of bits equal to: (a number of sub-carriers on an associated sub-band) multiplied by (a number of bits intended for an associated MCS symbol) divided by (a first coding rate for the associated sub-band).

16. The medium of claim 15, wherein the operations further comprise receiving a PHY header, the PHY header containing an EDMG-Header-A field to indicate which MCS is to be associated with which sub-band.

17. The medium of claim 15, wherein the operations further comprise communicating over a millimeter wave band.

* * * * *